(12) United States Patent
Hama et al.

(10) Patent No.: US 10,950,458 B2
(45) Date of Patent: Mar. 16, 2021

(54) ETCHING METHOD

(71) Applicant: Tokyo Electron Limited, Tokyo (JP)

(72) Inventors: Yasutaka Hama, Miyagi (JP); Shinya Morikita, Miyagi (JP); Kiyohito Ito, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/238,612

(22) Filed: Jan. 3, 2019

(65) Prior Publication Data
US 2019/0214269 A1 Jul. 11, 2019

(30) Foreign Application Priority Data

Jan. 5, 2018 (JP) .............................. JP2018-000471

(51) Int. Cl.
*H01L 21/311* (2006.01)
*H01L 21/768* (2006.01)
*H01L 21/67* (2006.01)
*H01J 37/32* (2006.01)

(52) U.S. Cl.
CPC .... *H01L 21/31144* (2013.01); *H01J 37/3255* (2013.01); *H01J 37/32541* (2013.01); *H01J 37/32568* (2013.01); *H01J 37/32642* (2013.01); *H01J 37/32715* (2013.01); *H01L 21/31116* (2013.01); *H01L 21/67069* (2013.01); *H01L 21/76804* (2013.01); *H01L 21/76829* (2013.01); *H01J 2237/002* (2013.01); *H01J 2237/3343* (2013.01)

(58) Field of Classification Search
CPC ......... H01L 21/31144; H01L 21/67069; H01L 21/31116; H01L 21/76829; H01L 21/76804; H01J 37/32642; H01J 37/3255; H01J 37/32541; H01J 37/32568; H01J 37/32715; H01J 2237/3343; H01J 2237/002

See application file for complete search history.

(56) References Cited

U.S. PATENT DOCUMENTS

| 2002/0003126 A1* | 1/2002 | Kumar | H01L 21/31116 216/67 |
| 2005/0142863 A1* | 6/2005 | Spandre | H01L 21/31116 438/640 |
| 2014/0035010 A1* | 2/2014 | Cai | H01L 29/6653 257/288 |
| 2019/0252202 A1* | 8/2019 | Sakurai | H01L 21/3065 |

FOREIGN PATENT DOCUMENTS

| EP | 3435408 A1 * | 9/2017 | ......... H01L 21/3065 |
| JP | H08-199377 A | 8/1996 | |
| JP | 2010-245454 A | 10/2010 | |

* cited by examiner

*Primary Examiner* — Binh X Tran
*Assistant Examiner* — Mahmoud Dahimene
(74) *Attorney, Agent, or Firm* — Pearne & Gordon LLP

(57) ABSTRACT

An etching method is provided. The etching method is performed on a substrate having a first film to a third film. The third film is provided on an underlying region, the second film is provided on the third film, the first film is provided on the second film. The second film contains silicon and nitrogen. The first film to the third film are etched in sequence. Plasma of a processing gas containing fluorine and hydrogen is used in the etching of the first film to the third film. A temperature of the substrate is set to be equal to or less than 20° C. at least in the etching of the second film.

9 Claims, 12 Drawing Sheets

ETCHING METHOD

CROSS-REFERENCE TO RELATED APPLICATION

This application claims the benefit of Japanese Patent Application No. 2018-000471 filed on Jan. 5, 2018, the entire disclosure of which is incorporated herein by reference.

TECHNICAL FIELD

The various aspects and embodiments described herein pertain generally to an etching method.

BACKGROUND

In the manufacture of an electronic device, plasma etching is performed to form an opening in a film of a substrate. In the plasma etching, as a pattern of a mask is transferred to the film, the opening is formed in the film. For example, the film as an etching target is an insulating film, and a conductor for a contact is filled in the opening formed in the film. This plasma etching is described in Patent Document 1 and Patent Document 2.

In the plasma etching disclosed in Patent Document 1 and Patent Document 2, a deposit is formed on a surface of the film to narrow a width of the opening formed in the film. To be specific, a processing gas such as $C_4F_8$ including a molecule having many carbon atoms is used, and the film is etched while a deposit containing carbon is formed on the film and the mask. By etching the film while forming the deposit on the film and the mask, the width of the opening formed in the film is narrowed with a rise of a distance from a top surface of the film, that is, the opening formed in the film has a taper shape.

Patent Document 1: Japanese Patent Laid-open Publication No. H08-199377

Patent Document 2: Japanese Patent Laid-open Publication No. 2010-245454

As stated above, in the plasma etching in which the film is etched while the deposit containing the carbon is formed, the opening of the mask and/or the opening formed in the film may be clogged with the deposit, so that the etching may not proceed. In view of this, in the formation of the opening having the taper shape at least partially, it is required not to hamper the progress of the etching.

SUMMARY

In one exemplary embodiment, there is provided an etching method. The etching method is performed on a substrate having a first film, a second film and a third film. The third film is provided on an underlying region, the second film is provided on the third film, the first film is provided on the second film. The second film contains silicon and nitrogen. A mask provided with an opening is provided on the first film. The etching method includes (i) etching the first film by plasma etching to form in the first film a first opening continuous with the opening of the mask; (ii) etching the second film by plasma etching to form in the second film a second opening continuous with the first opening; and (iii) etching the third film by plasma etching to form in the third film a third opening continuous with the second opening. To allow a width of the third opening to be smaller than a width of the first opening and allow the second opening to have a taper shape such that a width of the second opening at a third opening side is smaller than a width of the second opening at a first opening side, plasma of a processing gas containing fluorine and hydrogen is used in the plasma etching of each of the etching of the first film, the etching of the second film and the etching of the third film, and a temperature of the substrate is set to be equal to or less than 20° C. at least in the etching of the second film.

In the etching method according to the exemplary embodiment, the first film to the third film are etched by active species of fluorine atoms or fluorine-containing molecules. Further, at the temperature equal to or less than 20° C., ammonium fluorosilicate is generated from the fluorine and the hydrogen in the processing gas and the silicon and the nitrogen constituting the second film during the etching of the second film, and as this ammonium fluorosilicate adheres to a surface forming and confining the opening formed in the second film, a deposit is formed. Accordingly, the second opening formed in the second film has the taper shape. Further, in the etching method according to the exemplary embodiment, the deposit can be formed without using carbon. Thus, the formation of the deposit which hampers the etching can be suppressed.

The temperature of the substrate may be set to be equal to or less than −30° C. at least in the etching of the second film.

Each of the first film and the third film is a silicon-containing film without containing nitrogen. Each of the first film and the third film include any one of a silicon oxide film, a silicon-containing low dielectric film and a silicon carbide film.

The processing gas is a mixed gas including a fluorine-containing gas and a hydrogen-containing gas. The fluorine-containing gas may be a $CF_4$ gas, a $C_4F_8$ gas, a $CHF_3$ gas, a $CH_2F_2$ gas or a $SF_6$ gas. The hydrogen-containing gas may be a hydrogen gas.

A concentration of a nitrogen atom included in the processing gas is equal to or less than 10 at. %. If the mask is made of an organic material and a concentration of the nitrogen in the processing gas is high, the mask is etched during the plasma etching, so that selectivity is decreased. According to the present exemplary embodiment, however, such a decrease of the selectivity is suppressed.

The substrate further includes two gate regions. The two gate regions are provided on the underlying region and covered with the third film. The underlying region includes a semiconductor region doped with an impurity. The semiconductor region is located under a partial region of the third film between the two gate regions. The third opening is formed in the partial region. According to the present exemplary embodiment, the first opening having a relatively large width is formed. Accordingly, it becomes easier to bury in the first opening to the third opening a conductor for a contact to the underlying region. Further, as the second opening is formed to have the taper shape and a width of the third opening is narrowed, a distance between each of the two gate regions and the third opening is secured. Therefore, a relatively large distance is secured between each of the two gate regions and the contact.

The substrate further includes two wiring regions. The underlying region includes a gate region. The gate region is provided between the two wiring regions. The gate region is located under a partial region of the third film between the two wiring regions. The third opening is formed in the partial region. According to the present exemplary embodiment, the first opening having a relatively large width is formed. Accordingly, it becomes easier to bury in the first opening to the third opening the conductor for the contact to the underlying region (gate region). Further, as the second opening is formed to have the taper shape and the width of the third opening is narrowed, a distance between each of the two wiring regions and the third opening is obtained. Therefore, a relatively large distance is secured between each of the two wiring regions and the contact.

At least in the etching of the second film, an absolute value of a self-bias potential of a lower electrode of a supporting table configured to support the substrate is set to be equal to or less than 2100 V.

As stated above, the etching is not impeded in the formation of the opening which has the taper shape at least partially.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
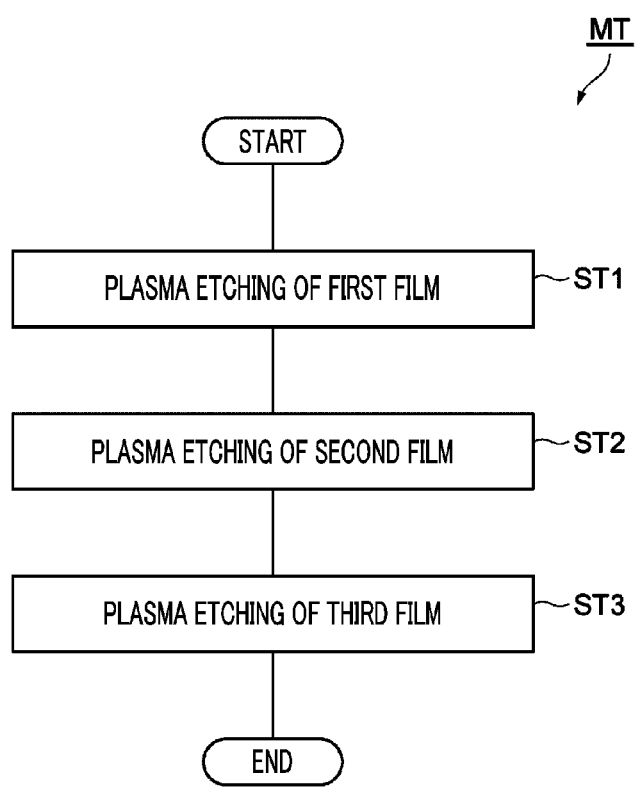
FIG. 1 is a flowchart illustrating an etching method according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described in detail with reference to accompanying drawings. In the various drawings, same or corresponding parts will be assigned same reference numerals.

Figure 2:
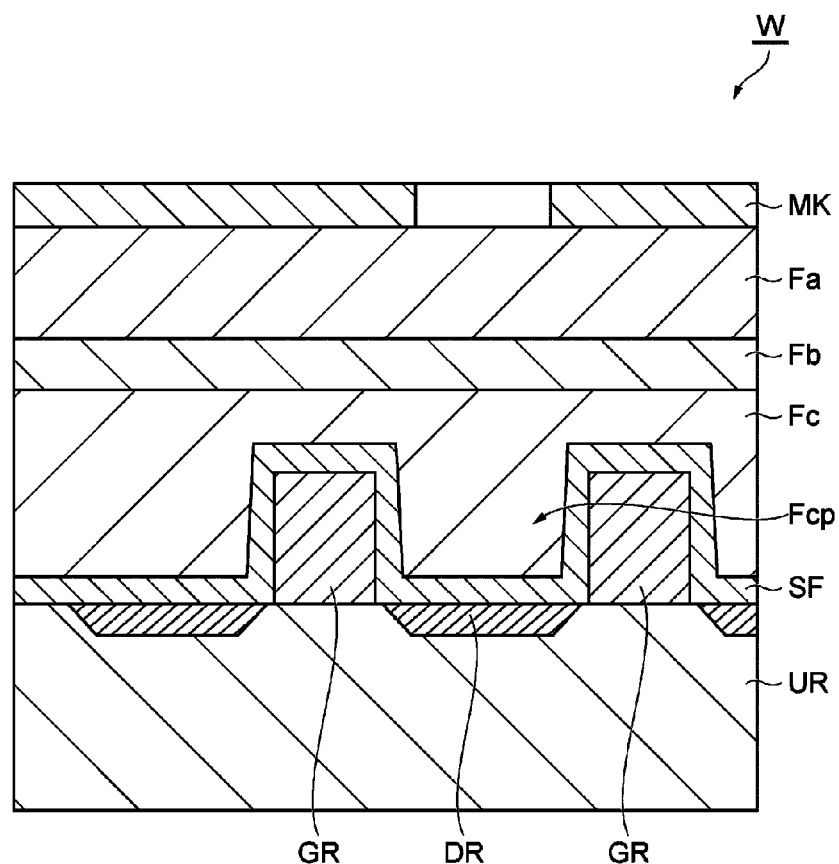
FIG. 2 is a partially enlarged cross sectional view of an example substrate to which the etching method shown in FIG. 1 is applicable.

FIG. 1 is a flowchart illustrating an etching method according to an exemplary embodiment. In the etching method (hereinafter, referred to as "method MT") shown in FIG. 1, a first film to a third film of a substrate W are etched by plasma etching. FIG. 2 is a partially enlarged cross sectional view of a substrate to which the etching method of FIG. 1 is applicable. The method MT can be applied to a substrate W shown in FIG. 2.

The substrate W shown in FIG. 2 has an underlying region UR, a first film Fa, a second film Fb and a third film Fc. The third film Fc is provided on the underlying region UR. The second film Fb is provided on the third film Fc. The first film Fa is provided on the second film Fb. The second film Fb contains silicon and nitrogen. The second film Fb is, by way of non-limiting example, a silicon nitride film (SiN film) or a silicon oxynitride film (SiON film). In the exemplary embodiment, each of the first film Fa and the third film Fc is a silicon-containing film, and does not contain nitrogen. In the exemplary embodiment, each of the first film Fa and the third film Fc includes any one of a silicon oxide film, a silicon-containing low dielectric film and a silicon carbide film.

A mask MK is provided on the first film Fa. The mask MK is provided with an opening. A material of the mask MK is not particularly limited as long as the first film to the third film are selectively etched with respect to the mask MK by the plasma etching of the first film to the third film. As an example, the mask MK may be made of an organic film. As another example, the mask MK may be made of a metal film.

As yet another example, the mask MK may be formed of a stacked body having a first layer to a third layer. The third layer is an organic film and provided on the first film Fa. The second layer is an antireflection film containing silicon and provided on the third layer. The first layer is a resist film and provided on the second layer. A resist mask is obtained by patterning of the first layer through a photolithography technique. Then, the second layer is etched to transfer the pattern of the resist mask to the second layer. The second layer may be etched by plasma of a processing gas containing fluorocarbon by using a plasma processing apparatus. Subsequently, the third layer is etched to transfer the pattern of the second layer to the third layer. The third layer may be etched by plasma of a processing gas containing nitrogen and hydrogen or by plasma of a processing gas containing oxygen by using the plasma processing apparatus. Through the etching of the third layer, the resist mask may be removed. Accordingly, as an example, the mask MK includes the etched second and third layers.

The substrate W may further include a plurality of gate regions GR and a stopper film SF. The number of the gate regions GR may be two or more. These gate regions GR are provided on the underlying region UR and are covered with the third film Fc. The underlying region UR includes a semiconductor region DR. The semiconductor region DR is located under a partial region Fcp of the third film Fc between two neighboring gate regions GR. The semiconductor region DR is made of, by way of example, but not limitation, silicon. The semiconductor region DR is doped with a first conductivity type or a second conductivity type impurity. The semiconductor region DR serves as a source region or a drain region. The stopper film SF is extended between each of the gate regions GR and the third film FC and between the third film Fc and the underlying region UR. The stopper film SF is a film configured to stop the plasma etching of the third film Fc and is made of, by way of example, silicon nitride.

Figure 3:
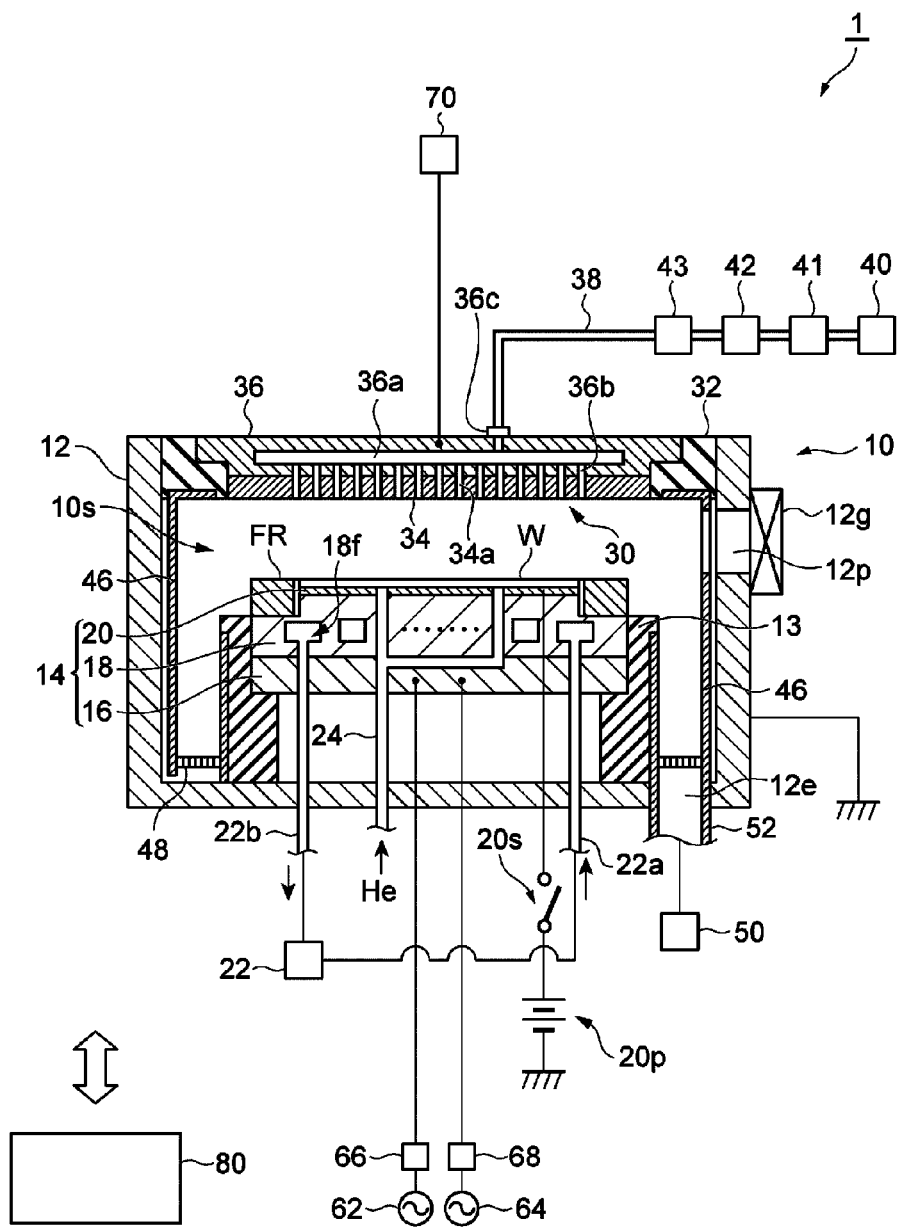
FIG. 3 is a diagram schematically illustrating an example plasma processing apparatus which can be used in performing the etching method shown in FIG. 1.

A plasma processing apparatus is used to perform the method MT. FIG. 3 is a diagram schematically illustrating an example plasma processing apparatus which can be used to perform the etching method shown in FIG. 1. A plasma processing apparatus 1 shown in FIG. 3 is a capacitively coupled plasma etching apparatus. The plasma processing apparatus 1 includes a chamber 10. The chamber 10 has an internal space 10s therein.

The chamber 10 includes a chamber main body 12. The chamber main body 12 is of a substantially cylindrical shape. The internal space 10s is provided inside the chamber main body 12. The chamber main body 12 is made of, by way of non-limiting example, aluminum. An inner wall surface of the chamber main body 12 is treated with a film having corrosion resistance. The film having the corrosion resistance may be a film made of ceramic such as aluminum oxide or yttrium oxide.

A passage 12p is formed at a sidewall of the chamber main body 12. The substrate W passes through the passage 12p when it is transferred between the internal space 10s and an outside of the chamber 10. The passage 12p is configured to be opened or closed by a gate valve 12g. The gate valve 12g is provided along the sidewall of the chamber main body 12.

A supporting member 13 is provided on a bottom portion of the chamber main body 12. The supporting member 13 is made of an insulating material and has a substantially cylindrical shape. The supporting member 13 is vertically extended from the bottom portion of the chamber main body 12 within the internal space 10s. The supporting member 13 is configured to support a supporting table 14. The supporting table 14 is provided within the internal space 10s. The supporting table 14 is configured to support the substrate W within the internal space 10s.

The supporting table 14 is equipped with a lower electrode 18 and an electrostatic chuck 20. The supporting table 14 may be further equipped with an electrode plate 16. The electrode plate 16 is made of a conductor such as, but not limited to, aluminum and has a substantially disk shape. The lower electrode 18 is provided on the electrode plate 16. The lower electrode 18 is made of a conductor such as, but not limited to, aluminum and has a substantially disk shape. The lower electrode 18 is electrically connected with the electrode plate 16.

The electrostatic chuck 20 is provided on the lower electrode 18. The substrate W is placed on a top surface of the electrostatic chuck 20. The electrostatic chuck 20 has a main body and an electrode. The main body of the electrostatic chuck 20 is formed of a dielectric material. The electrode of the electrostatic chuck 20 is a film-shaped electrode and provided within the main body of the electrostatic chuck 20. The electrode of the electrostatic chuck 20 is connected to a DC power supply 20p via a switch 20s. If a voltage from the DC power supply 20p is applied to the electrode of the electrostatic chuck 20, an electrostatic attracting force is generated between the electrostatic chuck 20 and the substrate W. The substrate W is attracted to and held by the electrostatic chuck 20 with the generated electrostatic attracting force.

A focus ring FR is provided on a peripheral portion of the lower electrode 18 to surround an edge of the substrate W. The focus ring FR is configured to improve uniformity of a plasma processing upon the substrate W within a surface thereof. The focus ring FR may be made of, but not limited to, silicon, silicon carbide or quartz.

A path 18f is provided within the lower electrode 18. A heat exchange medium (for example, a coolant) is supplied via a pipeline 22a into the path 18f from a chiller unit 22 provided at the outside of the chamber 10. The heat exchange medium supplied into the path 18f is returned back into the chiller unit 22 via a pipeline 22b. In the plasma processing apparatus 1, a temperature of the substrate W placed on the electrostatic chuck 20 is adjusted by heat exchange between the heat exchange medium and the lower electrode 18.

The plasma processing apparatus 1 is equipped with a gas supply line 24. Through the gas supply line 24, a heat transfer gas (e.g., a He gas) from a heat transfer gas supply mechanism is supplied into a gap between the top surface of the electrostatic chuck 20 and a rear surface of the substrate W.

The plasma processing apparatus 1 is further equipped with an upper electrode 30. The upper electrode 30 is provided above the supporting table 14. The upper electrode 30 is supported at an upper portion of the chamber main body 12 with a member 32 therebetween. The member 32 is made of a material having insulation property. The upper electrode 30 and the member 32 close a top opening of the chamber main body 12.

The upper electrode 30 may include a ceiling plate 34 and a supporting body 36. A bottom surface of the ceiling plate 34 is a surface directly facing the internal space 10s, and it forms and confines the internal space 10s. The ceiling plate 34 may be made of a conductor or a semiconductor having low Joule heat. The ceiling plate 34 is provided with multiple gas discharge holes 34a. These gas discharge holes 34a are formed through the ceiling plate 34 in a plate thickness direction.

The supporting body 36 is configured to support the ceiling plate 34 in a detachable manner. The supporting body 36 is made of a conductive material such as, but not limited to, aluminum. A gas diffusion space 36a is provided within the supporting body 36. The supporting body 36 is provided with multiple gas holes 36b. These multiple gas holes 36b are extended downwards from the gas diffusion space 36a to communicate with the multiple gas discharge holes 34a, respectively. The supporting body 36 is also provided with a gas inlet port 36c. The gas inlet port 36c is connected to the gas diffusion space 36a, and a gas supply line 38 is connected to this gas inlet port 36c.

The gas supply line 38 is connected to a gas source group 40 via a valve group 41, a flow rate controller group 42 and a valve group 43. The gas source group 40 includes a plurality of gas sources. The plurality of gas sources belonging to the gas source group 40 include sources of a plurality of gases used in the method MT. Each of the valve group 41 and the valve group 43 includes a plurality of opening/closing valves. The flow rate controller group 42 includes a plurality of flow rate controllers. Each of the flow rate controllers belonging to the flow rate controller group 42 may be a mass flow controller or a pressure control type flow rate controller. Each of the gas sources belonging to the gas source group 40 is connected to the gas supply line 38 via a corresponding opening/closing valve belonging to the valve group 41, a corresponding flow rate controller belonging to the flow rate controller group 42 and a corresponding opening/closing valve belonging to the valve group 43.

In the plasma processing apparatus 1, a shield 46 is provided along the inner wall surface of the chamber main body 12 in a detachable manner. Further, the shield 46 is also provided on an outer side surface of the supporting member 13. The shield 46 is configured to suppress an etching byproduct from adhering to the chamber main body 12. The shield 46 may be prepared by forming a film having corrosion resistance on a surface of a base member made of, by way of non-limiting example, aluminum. The film having corrosion resistance may be a film made of ceramic such as, but not limited to, yttrium oxide.

A baffle plate 48 is provided between the supporting member 13 and the sidewall of the chamber main body 12. The baffle plate 48 may be made of, by way of example, an aluminum base member coated with a film having corrosion resistance. The film having corrosion resistance may be a film made of ceramic such as, but not limited to, yttrium oxide. The baffle plate 48 is provided with a plurality of through holes. A gas exhaust port 12e is provided at the bottom portion of the chamber main body 12 under the baffle plate 48. The gas exhaust port 12e is connected with a gas exhaust device 50 via a gas exhaust line 52. The gas exhaust device 50 has a pressure control valve and a vacuum pump such as a turbo molecular pump.

The plasma processing apparatus 1 is further equipped with a first high frequency power supply 62 and a second high frequency power supply 64. The first high frequency power supply 62 is configured to generate a first high frequency power. The first high frequency power has a frequency suitable for plasma generation. The frequency of the first high frequency power is in a range from, e.g., 27 MHz to 100 MHz. The first high frequency power supply 62 is connected to the lower electrode 18 via a matching device 66 and the electrode plate 16. The matching device 66 is equipped with a circuit configured to match an output impedance of the first high frequency power supply 62 and an input impedance at a load side (lower electrode 18 side). Further, the first high frequency power supply 62 may be connected to the upper electrode 30 via the matching device 66.

The second high frequency power supply 64 is configured to generate a second high frequency power. The second high frequency power has a frequency lower than the frequency of the first high frequency power. When the first high frequency power and the second high frequency power are supplied together, the second high frequency power is used as a high frequency bias power for ion attraction into the substrate W. The frequency of the second high frequency power falls within a range from, e.g., 400 kHz to 13.56 MHz. The second high frequency power supply 64 is connected to the lower electrode 18 via a matching device 68 and the electrode plate 16. The matching device 68 is equipped with a circuit configured to match an output impedance of the second high frequency power supply 64 and the input impedance at the load side (lower electrode 18 side). Further, plasma may be generated by supplying the second high frequency power without supplying the first high frequency power, that is, by supplying a single high frequency power. In such a case, the frequency of the second high frequency power may be higher than 13.56 MHz, e.g., 40 MHz. In this case, the plasma processing apparatus 1 may not be equipped with the first high frequency power supply 62 and the matching device 66.

The plasma processing apparatus 1 may further include a DC power supply 70. The DC power supply 70 is connected to the upper electrode 30. The DC power supply 70 is configured to generate a negative DC voltage and apply the generated DC voltage to the upper electrode 30.

The plasma processing apparatus 1 may be further equipped with a control unit 80. The control unit 80 may be implemented by a computer including a processor, a storage unit such as a memory, an input device, a display device, a signal input/output interface, and so forth. The control unit 80 is configured to control individual components of the plasma processing apparatus 1. In the control unit 80, an operator can input commands through the input device to manage the plasma processing apparatus 1. Further, in the control unit 80, an operational status of the plasma processing apparatus 1 can be visually displayed on the display device. Further, the storage unit of the control unit 80 stores therein control programs and recipe data. The control programs are executed by the processor of the control unit 80 to perform various processings in the plasma processing apparatus 1. As the processor of the control unit 80 executes the control programs and controls the individual components of the plasma processing apparatus 1 according to the recipe data, the method MT is performed in the plasma processing apparatus 1.

Figure 4:
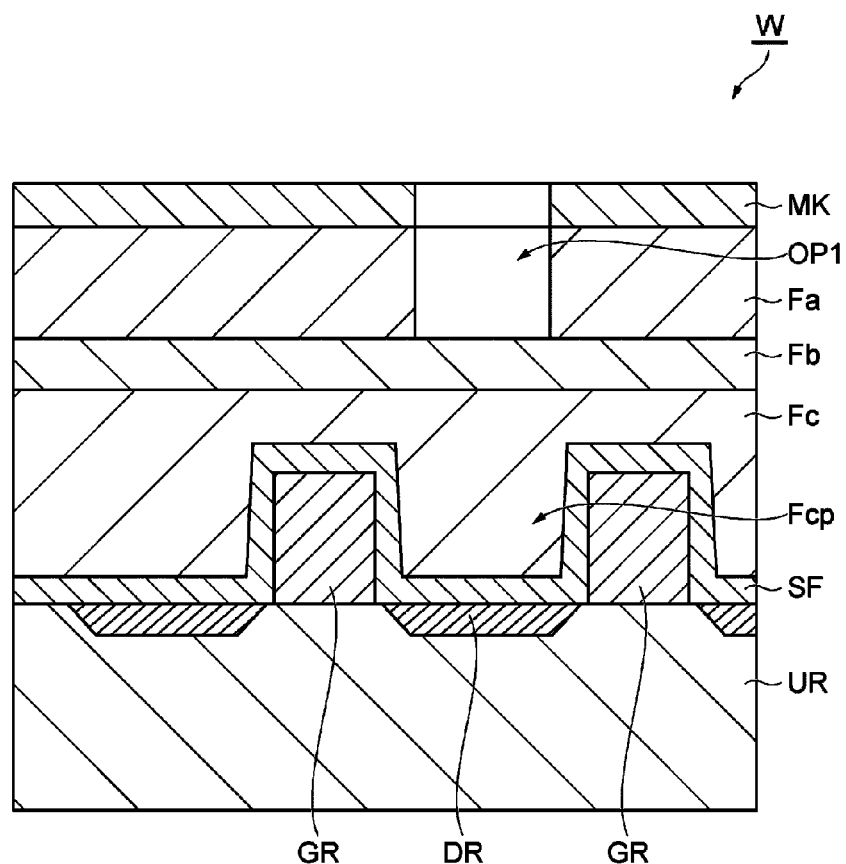
FIG. 4 is a partially enlarged cross sectional view illustrating a state of the substrate after a process ST1 of the etching method shown in FIG. 1 is performed.
Figure 5:
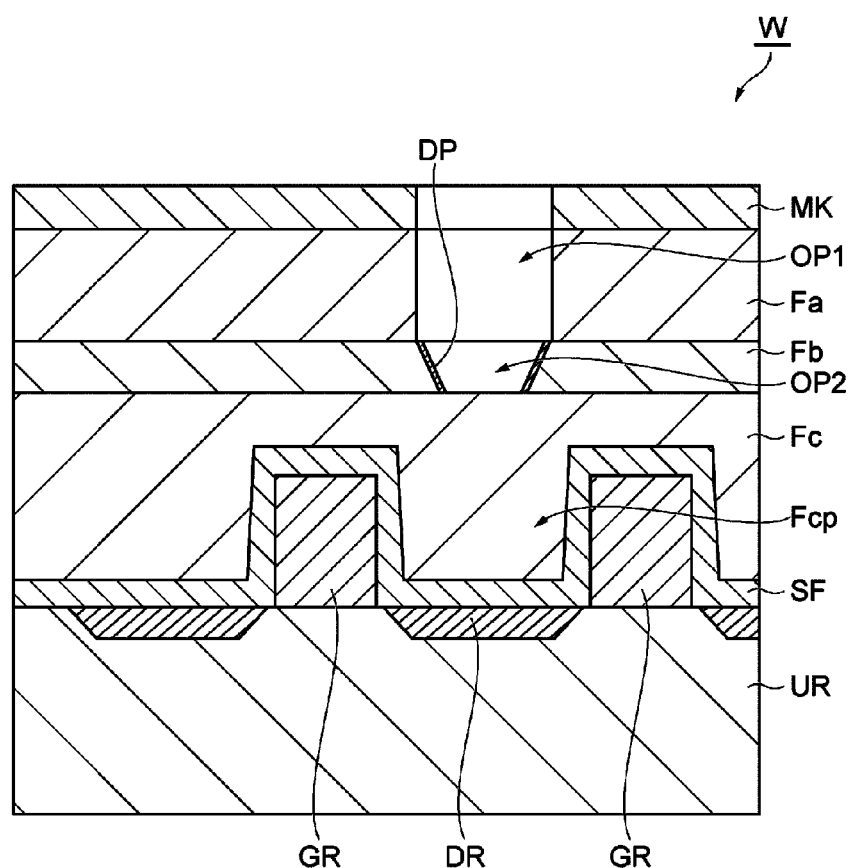
FIG. 5 is a partially enlarged cross sectional view illustrating a state of the substrate after a process ST2 of the etching method shown in FIG. 1 is performed.
Figure 6:
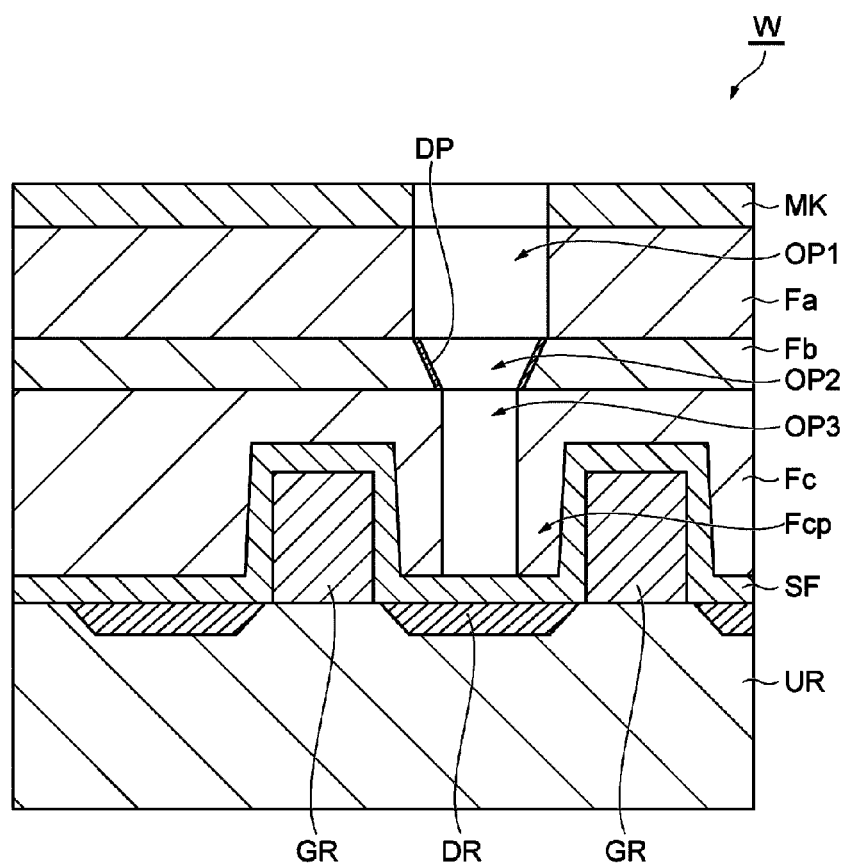
FIG. 6 is a partially enlarged cross sectional view illustrating a state of the substrate after a process ST3 of the etching method shown in FIG. 1 is performed.
Figure 7:
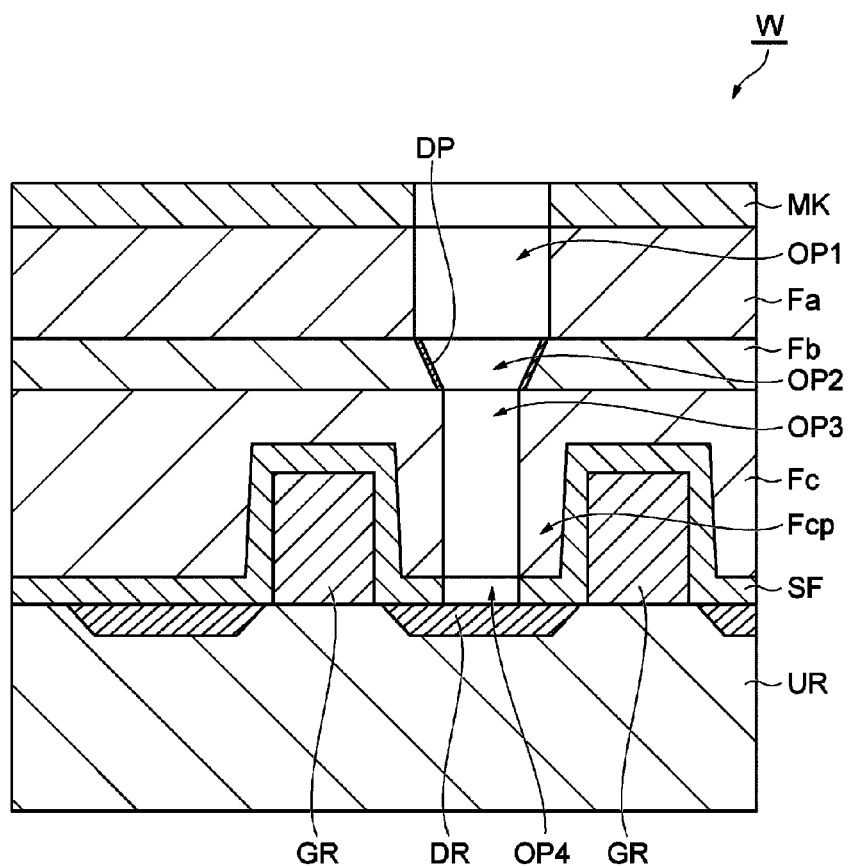
FIG. 7 is a partially enlarged cross sectional view illustrating a state of the substrate after a stopper film is etched.
Figure 8:
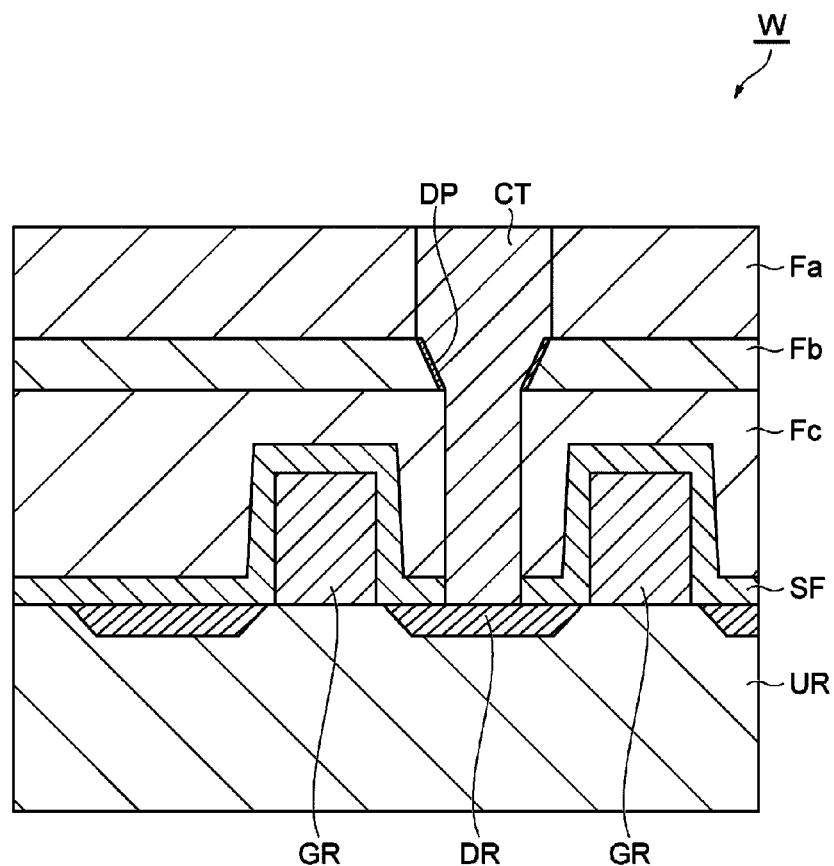
FIG. 8 is a partially enlarged cross sectional view of the substrate after a conductor is buried.

Hereinafter, the method MT will be described for an example case where the method MT is performed on the substrate W shown in FIG. 2 by using the plasma processing apparatus 1. In the following description, reference is made to FIG. 4 to FIG. 8 as well as FIG. 1. FIG. 4 is a partially enlarged cross sectional view illustrating a state of the substrate after a process ST1 of the etching method shown in FIG. 1 is performed. FIG. 5 is a partially enlarged cross sectional view illustrating a state of the substrate after a process ST2 of the etching method shown in FIG. 1 is performed. FIG. 6 is a partially enlarged cross sectional view illustrating a state of the substrate after a process ST3 of the etching method shown in FIG. 1 is performed. FIG. 7 is a partially enlarged cross sectional view illustrating a state of the substrate after a stopper film is etched. FIG. 8 is a partially enlarged cross sectional view illustrating a state of the substrate after a conductor is buried.

In the method MT, the substrate W is placed on the supporting table 14 (on the electrostatic chuck 20) and held by the electrostatic chuck 20. In the method MT, the process ST1, the process ST2 and the process ST3 are performed in the state that the substrate W is placed on the supporting table 14.

In the process ST1, the first film Fa is etched by plasma etching. In the process ST1, a processing gas is supplied into the internal space 10s. In the process ST1, the gas exhaust device 50 is controlled such that a pressure within the internal space 10s is set to a predetermined pressure. Further, in the process ST1, plasma of the processing gas is generated as the first high frequency power and/or the second high frequency power are/is supplied. The first film Fa is etched by ions and/or radicals from the plasma of the processing gas. As a result, as depicted in FIG. 4, a first opening OP1 continuous with the opening of the mask MK is formed in the first film Fa.

Then, the process ST2 is performed. In the process ST2, the second film Fb is etched by plasma etching. In the process ST2, a processing gas is supplied into the internal space 10s. In the process ST2, the gas exhaust device 50 is controlled such that the pressure within the internal space 10 is set to a predetermined pressure. Further, in the process ST2, as the first high frequency power and/or the second high frequency power are/is supplied, plasma of the processing gas is generated. The second film Fb is etched by ions and/or radicals from the plasma of the processing gas. As a consequence, as shown in FIG. 5, a second opening OP2 continuous with the first opening OP1 is formed in the second film Fb.

Subsequently, the process ST3 is performed. In the process ST3, the third film Fc is etched by plasma etching. In the process ST3, a processing gas is supplied into the internal space 10s. In the process ST3, the gas exhaust device 50 is controlled such that the pressure within the internal space 10s is set to a predetermined pressure. Further, in the process ST3, plasma of the processing gas is generated as the first high frequency power and/or the second high frequency power are/is supplied. The third film Fc is etched by ions and/or radicals from the plasma of the processing gas. As a result, as illustrated in FIG. 6, a third opening OP3 continuous with the second opening OP2 is formed in the third film Fc.

In the method MT, a width of the third opening OP3 is smaller than a width of the first opening OP1, and the second opening OP2 is formed to have a taper shape such that a width of the second opening OP2 at the side of the third opening OP3 is smaller than a width of the second opening OP2 at the side of the first opening OP1. For the purpose, in the plasma processing of each of the processes ST1 to ST3, plasma of a processing gas containing fluorine and hydrogen is used.

In the exemplary embodiment, the processing gas used in each of the processes ST1 to ST3 is a mixed gas including a fluorine-containing gas and a hydrogen-containing gas. The fluorine-containing gas does not contain carbon or has a low content ratio of carbon. The fluorine-containing gas is not a gas containing a high content ratio of carbon such as a $C_4F_6$ gas or a $C_5F_6$ gas but may be, by way of non-limiting example, a $CF_4$ gas, a $C_4F_8$ gas, a $CHF_3$ gas, a $CH_2F_2$ gas or a $SF_6$ gas. The hydrogen-containing gas may be, but not limited to, a hydrogen gas ($H_2$ gas).

The processing gas used in the respective processes ST1 to ST3 may include nitrogen. By way of example, the processing gas used in the respective processes ST1 to ST3 may include a nitrogen gas ($N_2$ gas) and/or a $NF_3$ gas. To suppress the etching of the mask MK, however, a concentration of the nitrogen in the processing gas used in the respective processes ST1 to ST3 is set to be low. Alternatively, the processing gas used in the respective processes ST1 to ST3 may not include nitrogen. In the exemplary embodiment, a concentration of nitrogen atoms in the processing gas used in the respective processes ST1 to ST3 is low, for example, equal to or less than 10 at. %.

Further, at least in the process ST2, the temperature of the substrate W is set to be equal to or less than 20° C. The temperature of the substrate W in the process ST2 may be equal to or less than −30° C. In the process ST1 and the process ST3 as well, the temperature of the substrate W may be set to be equal to or less than 20° C. The temperature of the substrate W in the process ST1 and the process ST3 may be equal to or less than −30° C.

According to the exemplary embodiment, at least in the process ST2, a self-bias potential of the lower electrode 18 is set to be equal to or higher than −2100 V. That is, in the exemplary embodiment, an absolute value of the negative self-bias potential of the lower electrode 18 at least in the second process ST2 is set to be equal to or less than 2100 V. The self-bias potential may be adjusted by adjusting a power level of the high frequency power supplied to the lower electrode 18. Further, in the process ST1 and the process ST3 as well, the self-bias potential of the lower electrode 18 may be set to be substantially equal to the self-bias potential of the lower electrode 18 in the process ST2.

In the method MT, after the process ST2, the stopper film SF may be etched to form a fourth opening OP4 continuous with the third opening OP3 (see FIG. 7). The stopper film SF may be etched by plasma of a processing gas including, by way of example, hydrofluorocarbon. Then, the mask MK is removed, and a conductor is filled in the first opening to the fourth opening. The conductor filled in the first opening to the fourth opening form a contact CT to the semiconductor region DR (see FIG. 8).

As stated above, in the method MT, the first to third films are etched by active species of fluorine atoms or fluorine-containing molecules. Further, at the temperature equal to or less than 20° C., ammonium fluorosilicate is generated from the fluorine and the hydrogen in the processing gas and the silicon and the nitrogen forming the second film during the etching of the second film. This ammonium fluorosilicate adheres to a surface forming and confining the opening formed in the second film Fb, so that a deposit DP is formed (see FIG. 5). Accordingly, the opening OP2 formed in the second film Fb has the taper shape. Further, in the method MT, the deposit DP can be formed without using carbon. Thus, it is possible to suppress formation of a deposit which hampers the etching.

In the exemplary embodiment, as stated above, the concentration of the nitrogen atoms in the processing gas used in the respective processes ST1 to ST3 is equal to or less than 10 at. %. In case that the mask MK is made of an organic material and the nitrogen concentration in the processing gas is high, the mask MK is etched during the plasma etching, so that the selectivity is decreased. According to the present exemplary embodiment, however, such a decrease in the selectivity is suppressed. Furthermore, in the method MT, since the nitrogen included in the second film Fb is used for the generation of the ammonium fluorosilicate, the processing gas need not include nitrogen or the concentration of the nitrogen atoms in the processing gas may be low.

In the exemplary embodiment, the self-bias potential of the lower electrode 18 in the process ST2 is set to be equal to or larger than −2100 V, as stated above. As a result, energy of the ions in the process ST2 is reduced, and the taper angle of the second opening OP2 is further reduced. Here, the taper angle refers to an angle formed by a surface forming and confining an opening with respect to a plane perpendicular to a film thickness direction of each of the first to third films. If the taper angle is 90°, the opening is vertically formed without having the taper shape. Meanwhile, the opening having the taper shape has an angle smaller than 90°.

So far, the various exemplary embodiments have been described. However, the exemplary embodiments are not limiting and various changes and modifications may be made. By way of example, the method MT can be performed by using any of various kinds of plasma processing apparatuses such as an inductively coupled plasma processing apparatus and a plasma processing apparatus configured to excite a processing gas by a surface wave such as a microwave.

Figure 9:
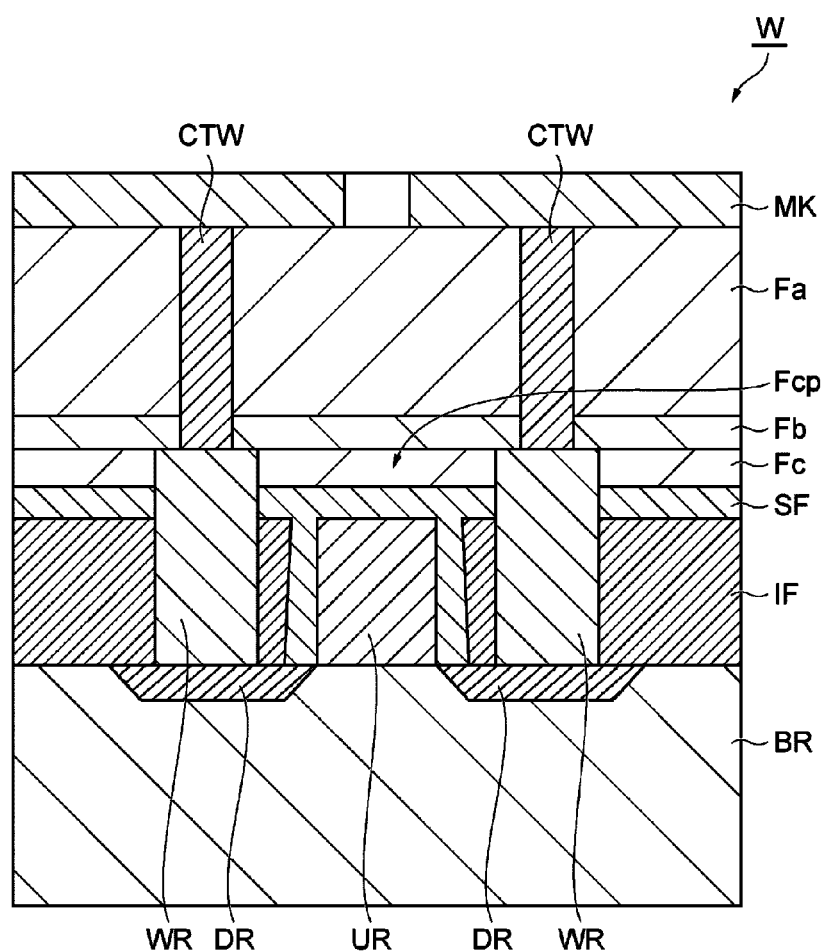
FIG. 9 is a partially enlarged cross sectional view of another example substrate to which the etching method shown in FIG. 1 is applicable.
Figure 10:
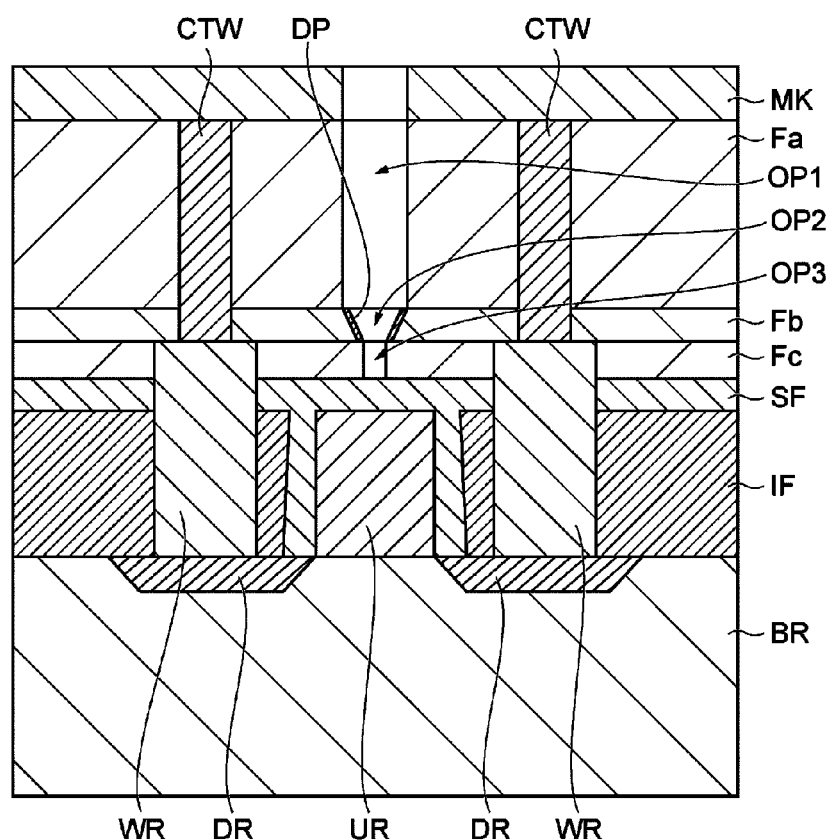
FIG. 10 is a partially enlarged cross sectional view illustrating a state of the another example substrate after the etching method shown in FIG. 1 is applied.

Further, the substrate W to which the method MT is applied may not be limited to the example substrate shown in FIG. 2 as long as the substrate W has the underlying region, the first to third films and the mask. Now, reference is made of FIG. 9 and FIG. 10. FIG. 9 is a partially enlarged cross sectional view of another example substrate to which the etching method of FIG. 1 is applicable. FIG. 10 is a partially enlarged cross sectional view illustrating a state of this another example substrate after the etching method of FIG. 1 is applied.

The method MT is also applicable to a substrate W shown in FIG. 9. The substrate W shown in FIG. 9 includes a mask MK, an underlying region UR, a first film Fa, a second film Fb and a third film Fc. The substrate W shown in FIG. 9 further includes a base region BR, multiple wiring regions WR and a stopper film SF. The base region BR is made of, by way of non-limiting example, silicon. In the substrate W shown in FIG. 9, the underlying region UR is a gate region and is provided on the base region BR. The underlying region UR is made of polycrystalline silicon or a conductor. The multiple wiring regions WR are provided on the base region BR. The underlying region UR is provided between two neighboring wiring regions WR. Semiconductor regions DR which are doped with impurities are provided within the base region BR under the wiring regions WR. The semiconductor region DR provided under one of the two neighboring wiring regions WR is a source region. The semiconductor region DR provided under the other of the two neighboring wiring regions WR is a drain region. An insulating film IF is extended on the semiconductor regions DR at both sides of the wiring regions WR.

The third film Fc is provided on the underlying region UR. The third film Fc is a silicon oxide film. The third film Fc is provided to cover the underlying region UR. That is, the underlying region UR is located under a partial region Fcp of the third film Fc between the two wiring regions WR. The stopper film SF is extended between the third film Fc and the underlying region UR. The stopper film SF is made of, by way of example, but not limitation, silicon nitride. The second film Fb is provided on the third film Fc. The second film Fb includes silicon and nitrogen. The first film Fa is provided on the second film Fb. The first film Fa is a silicon oxide film. The mask MK is the same as the mask MK of the substrate W shown in FIG. 2. The mask MK is patterned to provide an opening above the underlying region UR. Provided above each of the wiring regions WR is a contact CTW which is connected to a corresponding wiring region WR through the first film Fa and the second film Fb.

If the method MT is applied to the substrate W shown in FIG. 9, a first opening OP1 is formed in the first film Fa in the process ST1; a second opening OP2 is formed in the second film Fb in the process ST2; and a third opening OP3 is formed in the third film Fc in the process ST3, as depicted in FIG. 10. The first opening OP1 is continuous with the opening of the mask MK; the second opening OP2, continuous with the first opening OP1; and the third opening OP3, continuous with the second opening OP2. A width of the third opening OP3 is smaller than a width of the first opening OP1. The second opening OP2 has a taper shape between the first opening OP1 and the third opening OP3. After the process ST3 is performed, the stopper film SF of the substrate W shown in FIG. 10 may be etched so that a fourth opening continuous with the third opening OP3 may be formed in the stopper film SF. The stopper film SF is etched by plasma of a processing gas including hydrofluorocarbon. Then, the mask MK is removed, and a conductor may be filled in the first opening to the fourth opening. The conductor filled in the first opening to the fourth opening forms a contact to the underlying region UR (gate region).

Now, experiments conducted to evaluate the method MT will be explained. Here, however, it should be noted that the present disclosure is not limited to the following experiments.

(First Experiment)

In the first experiment, a first sample to a third sample are prepared. Each of the first sample to a third sample has a silicon nitride film forming a surface thereof. In the first experiment, the plasma processing is performed upon the first sample to the third sample by using the plasma processing apparatus 1. In the plasma processing of the first sample, the temperature of the first sample is set to be low, and the processing gas including fluorine and hydrogen is used. In the plasma processing of the second sample, the temperature of the second sample is set to be low, and the processing gas including fluorine but not including hydrogen is used. In the plasma processing of the third sample, the processing gas including the fluorine and the hydrogen is used, but the temperature of the third sample is set to be relatively high.

Below, conditions for the plasma processings upon the first sample to the third sample are specified.

<Conditions for the Plasma Processing Upon the First Sample>
First high frequency power: 100 MHz, 2500 W
Second high frequency power: 0.4 MHz, 1000 W
Pressure within the internal space 10s: 10.7 Pa (80 mTorr)
Flow rate ratios of respective gases in the processing gas
$SF_6$ gas: 20%
$H_2$ gas: 80%
Sample temperature: −60° C.

<Conditions for the Plasma Processing Upon the Second Sample>
First high frequency power: 100 MHz, 2500 W
Second high frequency power: 0.4 MHz, 1000 W
Pressure within the internal space 10s: 10.7 Pa (80 mTorr)
Flow rate ratios of respective gases in the processing gas
$SF_6$ gas: 100%
Sample temperature: −60° C.

<Conditions for the Plasma Processing Upon the Third Sample>
First high frequency power: 100 MHz, 2500 W
Second high frequency power: 0.4 MHz, 1000 W
Pressure within the internal space 10s: 10.7 Pa (80 mTorr)
Flow rate ratios of respective gases in the processing gas
$SF_6$ gas: 20%
$H_2$ gas: 80%
Sample temperature: 25° C.

Figure 11A:
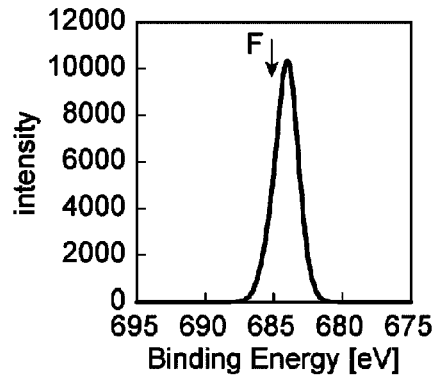
FIG. 11A and FIG. 11B show a result of X-ray photoelectron spectroscopy analysis upon a surface of a first sample.
Figure 11B:
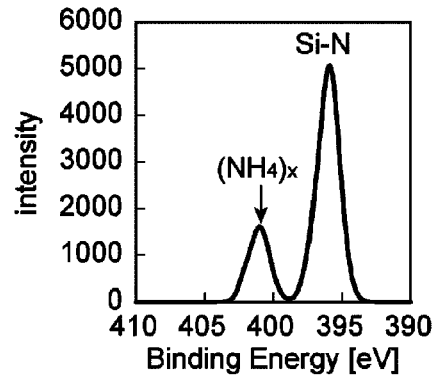
Figure 11C:
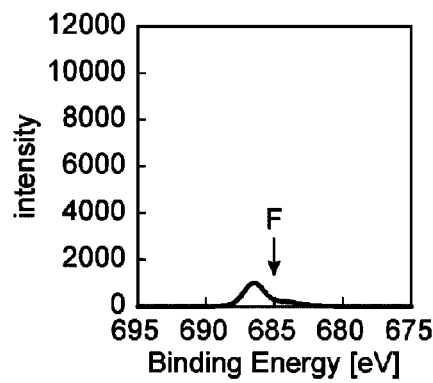
FIG. 11C and FIG. 11D, a result of X-ray photoelectron spectroscopy analysis upon a surface of a second sample.
Figure 11D:
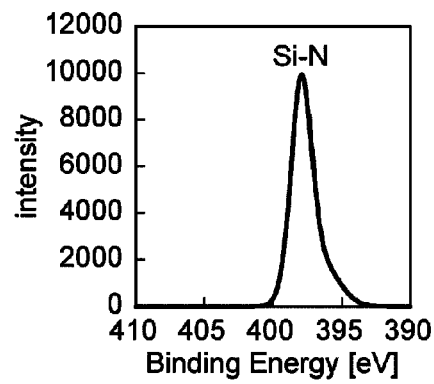
Figure 11E:
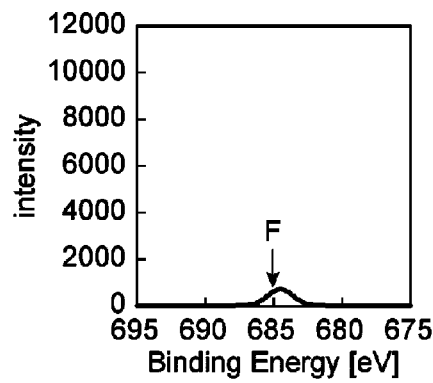
FIG. 11E and FIG. 11F, a result of X-ray photoelectron spectroscopy analysis upon a surface of third sample.
Figure 11F:
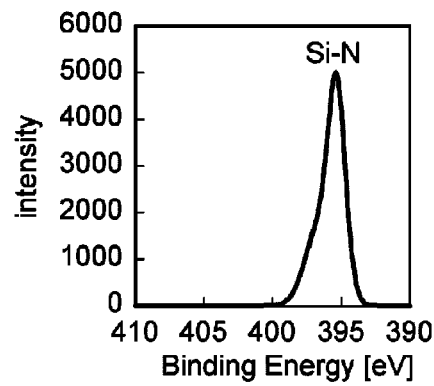

In the first experiment, the surface of each of the first sample to the third sample after being processed is analyzed through X-ray photoelectron spectroscopy analysis. FIG. 11A and FIG. 11B show a result of the X-ray photoelectron spectroscopy analysis upon the surface of the first sample; FIG. 11C and FIG. 11D, a result of the X-ray photoelectron spectroscopy analysis upon the surface of the second sample; FIG. 11E and FIG. 11F, a result of the X-ray photoelectron spectroscopy analysis upon the surface of the third sample. Each of FIG. 11A, FIG. 11C and FIG. 11E provides a $F_{1s}$ spectrum, and each of FIG. 11B, FIG. 11D and FIG. 11F provides a $N_{1s}$ spectrum.

As shown in FIG. 11A and FIG. 11B, a peak of each of a fluorine (F), a Si—N bond and $(NH_4)_x$ is observed. Thus, it is found out that ammonium fluorosilicate is deposited on the surface of the first sample. Meanwhile, as shown in FIG. 11C, FIG. 11D, FIG. 11E and FIG. 11F, the peak of the fluorine (F) is small and the peak of $(NH_4)_x$ is not observed in the second sample and the third sample. Thus, it is found out that ammonium fluorosilicate is not deposited on the surface of each of the second sample and the third sample. From these results, it is found out that ammonium fluorosilicate can be deposited on the film containing the silicon and the nitrogen by performing the plasma processing upon the corresponding film with the processing gas including the fluorine and the hydrogen while setting the temperature of the substrate to be low.

(Second Experiment)

In the second experiment, a fourth sample to a thirteenth sample are prepared. Each of the fourth sample to the thirteenth sample has a silicon nitride film and a mask provided on the silicon nitride film. In the second experiment, by performing the plasma etching upon the silicon nitride film of each of the fourth sample to the thirteenth sample by using the plasma processing apparatus 1, a through hole is formed in the corresponding silicon nitride film. The mask of each of the fourth sample to the eighth sample is patterned such that the through hole having a small width is formed in the silicon nitride film. The mask of each of the ninth sample to the thirteenth sample is patterned such that the through hole having a large width is formed in the silicon nitride film. In the second experiment, the temperature of each of the fourth sample to the thirteenth sample in the plasma etching is adjusted.

Below, conditions for the plasma etching in the second experiment are specified.

<Conditions for the Plasma Etching in the Second Experiment>

First high frequency power: 60 MHz, 0 W
Second high frequency power: 40 MHz, 1400 W
Pressure within the internal space 10s: 3.3 Pa (25 mTorr)
Flow rate ratios of respective gases in the processing gas
$CF_4$ gas: 20%
$NF_3$ gas: 6%
$H_2$ gas: 74%

Figure 12:
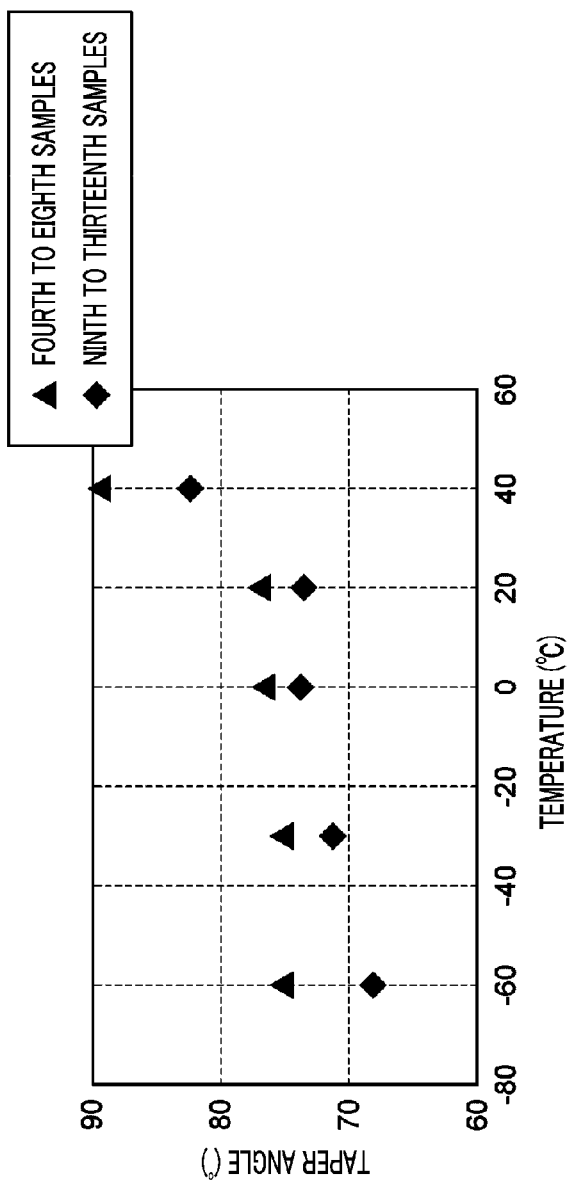
FIG. 12 is a graph showing taper angles of through holes in a fourth sample to a thirteenth sample.

In the second experiment, the taper angle of the through hole formed in the silicon nitride film of each of the fourth sample to the thirteenth sample is measured, and a result is shown in FIG. 12. In FIG. 12, a horizontal axis represents the temperature of the sample in the plasma etching, and a vertical axis indicates the taper angle of the through hole. As can be seen from FIG. 12, when the temperature of the sample is equal to or less than 20° C. while the plasma etching is performed, the taper angle is found to be quite smaller than 90 degrees. Further, when the temperature of the sample is equal to or less than −30° C. while the plasma etching is performed, the taper angle is found to be remarkably smaller than 90 degrees.

(Third Experiment)

In the third experiment, a fourteenth sample and a sixteenth sample are prepared. Each of the fourteenth sample to the sixteenth sample has a silicon oxide film and a mask provided on the silicon oxide film. The mask is an organic mask provided with an opening. In the third experiment, the plasma etching is performed on the silicon oxide film of each of the fourteenth sample to the sixteenth sample. In the third experiment, the flow rate ratio of the nitrogen gas in the processing gas used in the plasma etching of the fourteenth sample to the sixteenth sample is adjusted. To be specific, the flow rate ratio of the nitrogen gas in the processing gas used in the plasma etching of the fourteenth sample is 0%; the flow rate ratio of the nitrogen gas in the processing gas used in the plasma etching of the fifteenth sample is 20%; and the flow rate ratio of the nitrogen gas in the processing gas used in the plasma etching of the sixteenth sample is 30%. The concentration of the nitrogen atoms in the processing gas used in the plasma etching of the fourteenth sample is 0 at. %; the concentration of the nitrogen atoms in the processing gas used in the plasma etching of the fifteenth sample is 8.4 at. %; and the concentration of the nitrogen atoms in the processing gas used in the plasma etching of the sixteenth sample is 12 at. %.

Below, other conditions for the plasma etching in the third experiment are specified.

<Conditions for the Plasma Etching in the Third Experiment>

First high frequency power: 60 MHz, 0 W
Second high frequency power: 40 MHz, 1400 W
Pressure within the internal space 10s: 3.333 Pa (25 mTorr)
Flow rate ratios of respective gases in the processing gas (flow rate ratios when the nitrogen gas is not added)
$CF_4$ gas: 21%
$H_2$ gas: 79%
Sample temperature: −60° C.

In the third experiment, a ratio of a decrement of a film thickness of the silicon oxide film by the plasma etching with respect to a decrement of a film thickness of the mask by the plasma etching, that is, the selectivity is calculated. As a result, the selectivity of the fourteenth sample is found to be of an infinite value; the selectivity of the fifteenth sample, a value of 7; and the selectivity of the sixteenth sample, a value of 5. From this result, it is conjectured that the selectivity larger than 5 can be obtained if the concentration of the nitrogen atoms in the processing gas is equal to or less than 10 at. %.

(Fourth Experiment)

In the fourth experiment, a seventeenth sample to a nineteenth sample are prepared. Each of the seventeenth sample to the nineteenth sample has an underlying region, a first to a third film and a mask. The third film is a silicon oxide film and provided on the underlying region. The second film is a silicon nitride film and provided on the third film. The first film is a silicon oxide film and provided on the second film. The mask is a photoresist mask provided with an opening. In the fourth experiment, the plasma etching is performed on the first film to the third film of each of the seventeenth sample to the nineteenth sample by using the plasma processing apparatus 1, so that a first opening to a third opening are formed in the first film to the third film, respectively. In the fourth experiment, the power level of the second high frequency power in the plasma etching of the seventeenth sample to the nineteenth sample is adjusted. To elaborate, the power level of the second high frequency power in the plasma etching of the seventeenth sample is set to 1 kW; the power level of the second high frequency power in the plasma etching of the eighteenth sample, 3 kW; the power level of the second high frequency power in the plasma etching of the nineteenth sample, 5 kW. The self-bias potential of the lower electrode 18 in the plasma etching of the seventeenth sample is −1200 V; the self-bias potential of the lower electrode 18 in the plasma etching of the eighteenth sample, −1650 V; the self-bias potential of the lower electrode 18 in the plasma etching of the nineteenth sample, −2100 V.

Now, other conditions for the plasma etching in the fourth experiment are specified.

<Conditions for the Plasma Etching in the Fourth Experiment>

First high frequency power: 100 MHz, 2.3 kW
Second high frequency power: 3 MHz
Pressure within the internal space 10s: 3.333 Pa (25 mTorr)
Flow rate ratios of respective gases in the processing gas
$H_2$ gas: 45%
$CH_2F_2$ gas: 24%
$NF_3$ gas: 24%
$SF_6$ gas: 7%
Sample temperature: −60° C.

In the fourth experiment, the taper angles of the firth opening to the third opening formed in each of the seventeenth sample to the nineteenth sample are measured. As a result, the taper angles of the first opening to the third opening of the seventeenth sample are found to be 87.5°, 84.0° and 87.7°, respectively. Further, the taper angles of the first opening to the third opening of the eighteenth sample are found to be 87.0°, 84.9° and 88.0°, respectively. Further, the taper angles of the first opening to the third opening of the nineteenth sample are found to be 86.5°, 84.9° and 88.2°, respectively. That is, in each of the seventeenth sample to the nineteenth sample, the taper angle of the second opening is found to be considerably smaller than the taper angle of the first opening and the taper angle of the third opening. Thus, it is found out that if the self-bias potential of the lower electrode 18 is equal to or larger than −2100 V (if the absolute value of the self-bias potential of the lower electrode 18 is equal to or less than 2100 V), the second opening formed in the second film can have the taper shape.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. An etching method of etching a first film, a second film and a third film of a substrate, the third film being provided on an underlying region, the second film being provided on the third film, the first film being provided on the second film, the second film containing silicon and nitrogen, and a mask provided with an opening being provided on the first film, the etching method comprising:
    etching the first film by plasma etching to form in the first film a first opening continuous with the opening of the mask;
    etching the second film by plasma etching to form in the second film a second opening continuous with the first opening; and
    etching the third film by plasma etching to form in the third film a third opening continuous with the second opening,
    wherein, to allow a width of the third opening to be smaller than a width of the first opening and allow the second opening to have a taper shape such that a width of the second opening at a third opening side is smaller than a width of the second opening at a first opening side, plasma of a processing gas containing fluorine and hydrogen is used in the plasma etching of each of the etching of the first film, the etching of the second film and the etching of the third film, and a temperature of the substrate is set to be equal to or less than 20° C. at least in the etching of the second film,
    the taper shape of the second opening is formed by a deposit of ammonium fluorosilicate that is generated from the fluorine and hydrogen in the processing gas and the silicon and nitrogen in the second film, and adheres to a surface of the second opening, and
    the processing gas is a mixed gas including a fluorine-containing gas and a hydrogen-containing gas,
    the fluorine-containing gas does not contain carbon, and
    the hydrogen-containing gas is a hydrogen gas.

2. The etching method of claim 1,
    wherein the temperature of the substrate is set to be equal to or less than −30° C. at least in the etching of the second film.

3. The etching method of claim 1,
    wherein each of the first film and the third film is a silicon-containing film without containing nitrogen.

4. The etching method of claim 3,
    wherein each of the first film and the third film include any one of a silicon oxide film, a silicon-containing low dielectric film and a silicon carbide film.

5. The etching method of claim 1, wherein the fluorine-containing gas is a $SF^6$ gas.

6. The etching method of claim 1,
    wherein a concentration of a nitrogen atom included in the processing gas is equal to or less than 10 atomic %.

7. The etching method of claim 1,
    wherein the substrate further includes two gate regions provided on the underlying region and covered with the third film, and
    the underlying region includes a semiconductor region doped with an impurity, and the semiconductor region is located under a partial region of the third film between the two gate regions, and
    the third opening is formed in the partial region.

8. The etching method of claim 1,
    wherein the substrate further includes two wiring regions,
    the underlying region includes a gate region provided between the two wiring regions, and the gate region is located under a partial region of the third film between the two wiring regions, and
    the third opening is formed in the partial region.

9. The etching method of claim 1,
    wherein at least in the etching of the second film, an absolute value of a self-bias potential of a lower electrode of a supporting table configured to support the substrate is set to be equal to or less than 2100 V.

* * * * *

UNITED STATES PATENT AND TRADEMARK OFFICE
CERTIFICATE OF CORRECTION

PATENT NO. : 10,950,458 B2
APPLICATION NO. : 16/238612
DATED : March 16, 2021
INVENTOR(S) : Yasutaka Hama et al.

Page 1 of 1

It is certified that error appears in the above-identified patent and that said Letters Patent is hereby corrected as shown below:

In the Claims

Column 16, Line 36, delete "$SF^6$" and insert -- $SF_6$ --.

Signed and Sealed this
Fifteenth Day of February, 2022

Drew Hirshfeld
*Performing the Functions and Duties of the*
*Under Secretary of Commerce for Intellectual Property and*
*Director of the United States Patent and Trademark Office*